(12) United States Patent
Omote et al.

(10) Patent No.: US 11,306,022 B2
(45) Date of Patent: Apr. 19, 2022

(54) CASING, ELECTRONIC DEVICE, AND CASING PRODUCTION METHOD

(71) Applicant: FUJITSU LIMITED, Kawasaki (JP)

(72) Inventors: Koji Omote, Isehara (JP); Koichi Kimura, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 317 days.

(21) Appl. No.: 16/217,393

(22) Filed: Dec. 12, 2018

(65) Prior Publication Data

US 2019/0194066 A1 Jun. 27, 2019

(30) Foreign Application Priority Data

Dec. 27, 2017 (JP) .............................. JP2017-251067

(51) Int. Cl.
| | | |
|---|---|---|
| C03C 17/34 | (2006.01) | |
| C03C 3/085 | (2006.01) | |
| C03C 21/00 | (2006.01) | |
| B32B 17/10 | (2006.01) | |
| B32B 7/12 | (2006.01) | |
| H05K 5/03 | (2006.01) | |
| C03C 17/42 | (2006.01) | |

(52) U.S. Cl.
CPC ............ *C03C 17/3411* (2013.01); *B32B 7/12* (2013.01); *B32B 17/10* (2013.01); *C03C 3/085* (2013.01); *C03C 17/42* (2013.01); *C03C 21/002* (2013.01); *H05K 5/03* (2013.01); *C03C 2217/78* (2013.01); *C03C 2218/365* (2013.01)

(58) Field of Classification Search
CPC ... C03C 17/3411; C03C 3/085; C03C 21/002; H05K 5/03; B32B 17/10; B32B 7/12
USPC .......................................... 427/407.2
See application file for complete search history.

(56) References Cited

U.S. PATENT DOCUMENTS

2015/0037543 A1* 2/2015 Keegan .................. C03C 17/32
428/192
2018/0162771 A1* 6/2018 Fujii ....................... C03C 3/085

FOREIGN PATENT DOCUMENTS

| JP | 4-243936 A | 9/1992 | |
|---|---|---|---|
| JP | 2013-6745 | 1/2013 | |
| JP | 2015-189654 A | 11/2015 | |
| JP | 2016-532625 | 10/2016 | |
| WO | 2017-026318 | 2/2017 | |
| WO | WO-2017026318 A1 * | 2/2017 | ............. C03C 3/085 |

OTHER PUBLICATIONS

Japanese Office Action dated Aug. 3, 2021 for corresponding Japanese Patent Application No. 2017-251067, with English Translation, 11 pages.

* cited by examiner

*Primary Examiner* — Tahseen Khan
(74) *Attorney, Agent, or Firm* — Fujitsu Patent Center (57) ABSTRACT

A casing includes a plate-shaped cover glass for use in an exterior portion of an article; an inorganic coating which covers an end surface of the cover glass; and a resin coating which is at least partially overlaid on the inorganic coating, and which forms an outer edge of the cover glass.

9 Claims, 10 Drawing Sheets

CASING, ELECTRONIC DEVICE, AND CASING PRODUCTION METHOD

CROSS-REFERENCE TO RELATED APPLICATION

This application is based upon and claims the benefit of priority of the prior Japanese Patent Application No. 2017-251067, filed on Dec. 27, 2017, the entire contents of which are incorporated herein by reference.

FIELD

The embodiments discussed herein are related to a casing, an electronic device, and a casing production method.

BACKGROUND

A cover glass is used in an exterior member of an article in some cases. For example, a portable device having a display section uses a cover glass with which the display section is covered (for example, see Japanese Laid-open Patent Publication No. 2013-6745, International Publication Pamphlet No. WO2017/026318, and Japanese National Publication of International Patent Application No. 2016-532625).

The cover glass for use in the exterior member is required to have impact resistance. However, a chip (sometimes also called "a micro-crack") is often generated in an end surface of a cover glass by a process of cutting out the cover glass from a plate glass as a raw material. If such a chip is left in the cover glass, cracking is likely to occur from the chip when an impact is applied to the cover glass. For the purpose of improving the impact resistance, the end surface of the cover glass may be polished to remove the chip. In this regard, however, the polishing requires quite a number of man-hours, and has difficulty in completely removing the chip. With the above circumstances taken into consideration, it is desirable to improve the impact resistance without polishing the end surface of the cover glass.

SUMMARY

According to an aspect of the embodiments, a casing includes a plate-shaped cover glass for use in an exterior portion of an article; an inorganic coating which covers an end surface of the cover glass; and a resin coating which is at least partially overlaid on the inorganic coating, and which forms an outer edge of the cover glass.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, embodiments are described. The embodiments discussed below are just illustrative examples, and are not intended to limit the technical scope of the present disclosure to the following embodiments.

Figure 1:
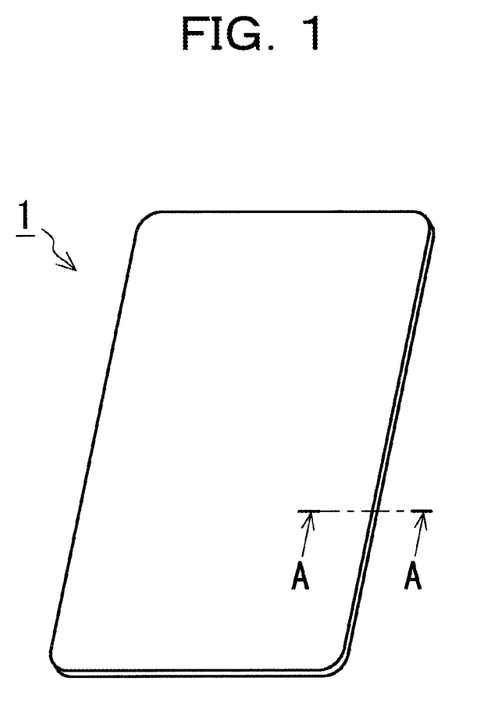
FIG. 1 is a view illustrating a cover glass according to an embodiment.

FIG. 1 is a view illustrating a cover glass according to an embodiment. A cover glass 1 is a plate-shaped glass usable in an exterior portion of an article. Examples of articles in which the cover glass 1 is usable in the exterior portion include portable information terminals such as a smartphone and a tablet, portable music players, displays for personal computers, thin television (TV) receivers, audio-video instruments, and other various types of electronic devices. Such an electronic device includes the cover glass 1, and a device main body (not illustrated) containing a processor such as a central processing unit (CPU) that performs various kinds of processing.

FIG. 1 depicts the flat cover glass 1 having a substantially rectangular shape with four rounded corners. The cover glass 1, however, is not limited to this shape. For example, the cover glass 1 may have four angular corners. The cover glass 1 may have, for example, any of various outer profiles such as a square, a circle, a triangle, and others. The cover glass 1 may have, for example, a whole shape curved to have curved surfaces.

The cover glass 1 may be a glass entirely colorless and transparent, a glass entirely colored and transparent, or a glass partially having a non-transparent portion by coloring.

Figure 2:
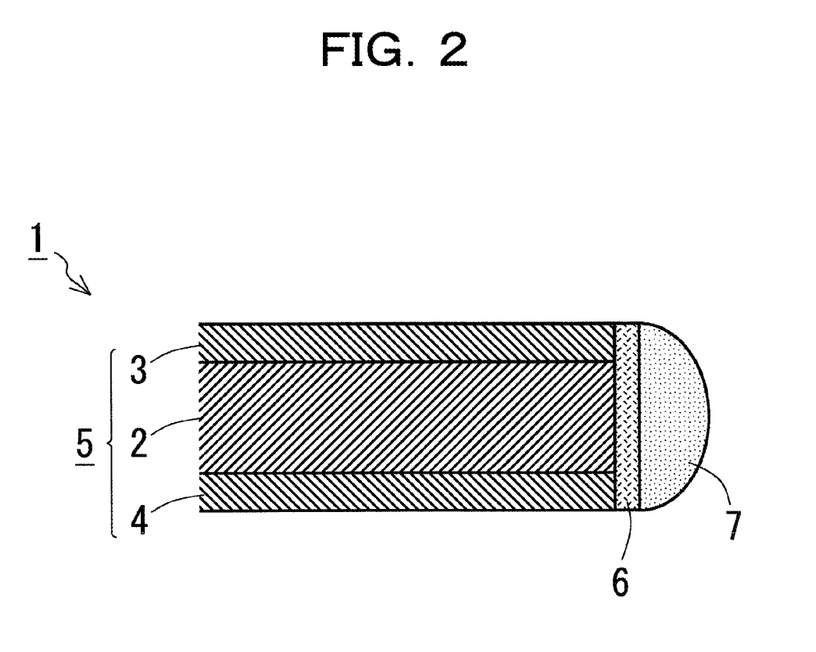
FIG. 2 is a cross sectional view of an edge of the cover glass taken along a line indicated by sign I-I in FIG. 1.

FIG. 2 is a cross sectional view of an edge of the cover glass 1 taken along a line indicated by sign I-I in FIG. 1. As illustrated in FIG. 2, the cover glass 1 includes a plate glass 5 including a naked layer 2 and reinforcing layers 3 and 4 that form the front and back surfaces of the cover glass 1 while sandwiching the naked layer 2 in between. The end surface of the plate glass 5 is covered with an inorganic coating 6. A resin coating 7 is overlaid on the inorganic coating 6. The resin coating 7 is overlaid on the inorganic coating 6 covering the end surface of the plate glass 5, and accordingly is arranged at the outermost edge portion to form an outer edge of the cover glass 1. The inorganic coating 6 and the resin coating 7 are provided over the entire outer peripheral edge of the plate glass 5.

The plate glass 5 is a glass in which surfaces of a plate-shaped glass are reinforced. In other words, the plate glass 5 is a glass in which the reinforcing layers 3 and 4 are formed by reinforcing the surfaces of the naked layer 2. As a method of forming the reinforcing layers 3 and 4 by reinforcing the surfaces of the naked layer 2, it is possible to use, for example, a reinforcing method using a chemical technique such as ion exchange, or any of other various types of reinforcing methods.

The inorganic coating 6 is formed by coating the end surface of the plate glass 5 over the entire outer peripheral edge of the plate glass 5. The inorganic coating 6 is solidified in a state where the inorganic coating 6 is filled through a capillary action into fine chips such as scratches or asperities formed in the end surface of the plate glass 5 by the process of cutting out the plate glass 5 from a raw plate material. The inorganic coating 6 fills up a chip in the end surface of the plate glass 5, and thereby reduces chances of occurrence of cracking from the chip. To this end, the inorganic coating 6 is preferably formed of an inorganic material such as glass. An example of the material capable of filling up a chip in the end surface of the plate glass 5 and thereby reducing chances of occurrence of cracking from the chip is a siloxane-based coating agent. Being a compound containing, as a skeleton, silicon which is a raw material for glass, the siloxane-based coating agent is capable of forming a glass-like film similar to the plate glass 5 and is also good in the adhesion to the plate glass 5. When the inorganic coating 6 is formed of the siloxane-based coating agent with an average thickness of about 100 nm to 3 μm, the inorganic coating 6 fills up a chip in the end surface of the plate glass 5 and reduces chances of occurrence of cracking from the chip.

The resin coating 7 is formed over the entire outer peripheral edge of the plate glass 5 while being overlaid on the inorganic coating 6. Thus, the resin coating 7 is a portion forming the outer edge of the cover glass 1. Forming the outer edge of the cover glass 1, the resin coating 7 is a portion hit by an object when the object hits against the edge of the cover glass 1. To relieve an impact transmitted to the plate glass 5 from the object hitting against the edge of the cover glass 1, the resin coating 7 is formed of a softer material than those of the plate glass 5 and the inorganic coating 6. An example of the material capable of relieving an impact transmitted to the plate glass 5 is a resin. The resin is softer than the glass and the siloxane-based coating, and therefore is capable of relieving an impact transmitted to the plate glass 5. The resin coating 7 may be formed of, for example, an ultraviolet curable resin. Since the ultraviolet curable resin may be cured speedily by ultraviolet irradiation, efficient production of the cover glass 1 may be possible. In order to relieve an impact transmitted to the plate glass 5, the resin coating 7 preferably has a Vickers hardness of 100 or less.

In the cover glass 1 of the above-described embodiment, the end surface of the plate glass 5 is coated with the inorganic coating 6. Even when a chip is formed in the end surface of the plate glass 5, that structure reduces chances of occurrence of cracking from the chip to the minimum possible extent. In this way, the cover glass 1 of the above-described embodiment achieves an improvement in the impact resistance even though the end surface of the plate glass 5 is not polished. Therefore, it is also possible to produce, for example, a larger cover glass 1 than conventional ones while maintaining the impact resistance.

The cover glass 1 may be produced by, for example, the following method.

Figure 3:
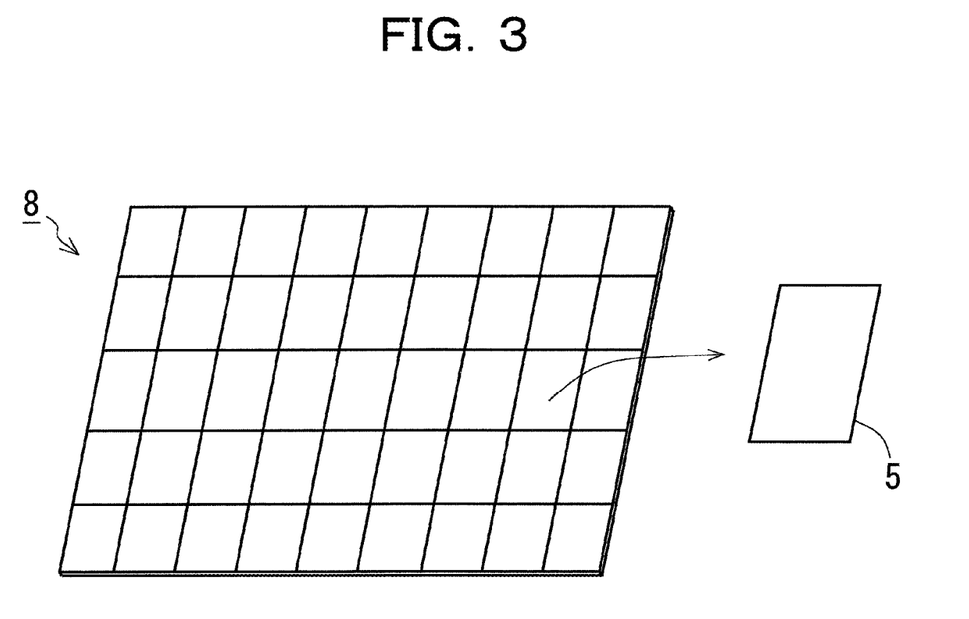
FIG. 3 is a view illustrating cutting of a plate glass from a plate material.

FIG. 3 is a view illustrating cutting of the plate glass 5 from a plate material. As illustrated in FIG. 3, for example, the plate glass 5 is obtained by being cut out from a raw material plate 8 which is larger than the plate glass 5. The plate glass 5 may be cut out from the raw material plate 8, for example, by moving a disk-shaped grindstone while rotating the grindstone at a high speed. In FIG. 3, the plate glass 5 is cut out from the raw material plate 8 having a longitudinal dimension equivalent to five plate glasses 5 and a lateral dimension equivalent to nine plate glasses 5. However, the raw material plate 8 is not limited to a plate material having such dimensions.

Figure 4:
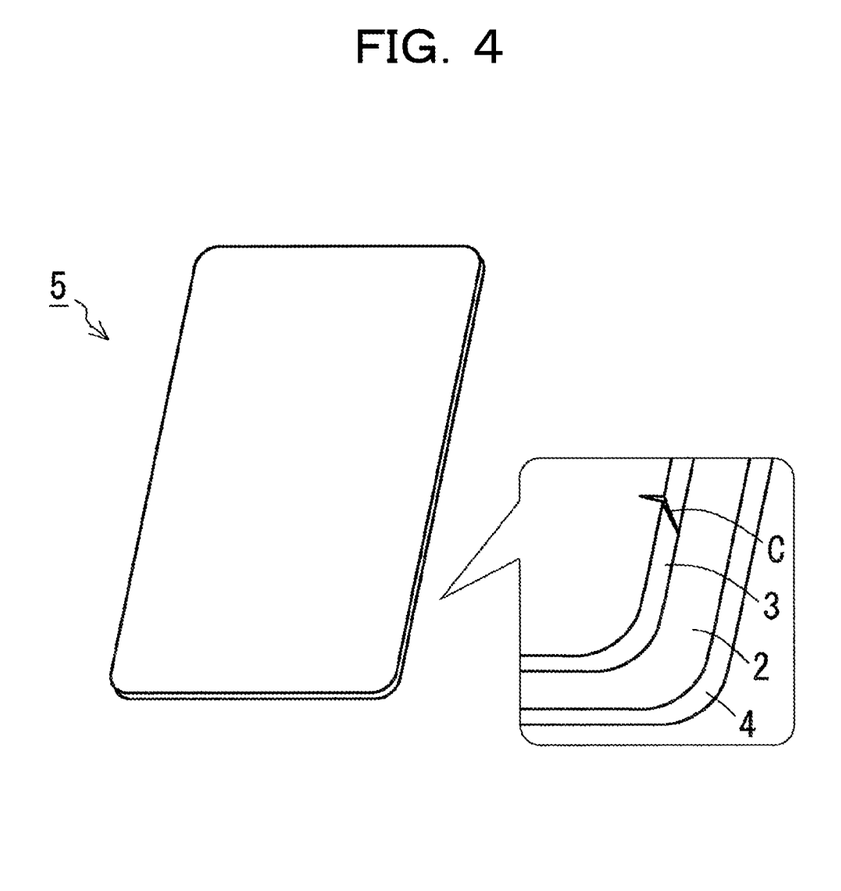
FIG. 4 is an enlarged view of a part of an end surface of a plate glass.

FIG. 4 is an enlarged view of a part of the end surface of the plate glass 5. When the plate glass 5 is cut out from the raw material plate 8, a chip C as illustrated in FIG. 4, for example, may be generated in the end surface of the plate glass 5 in some cases. If such a chip C is left in the end surface of the plate glass 5, cracking is likely to occur from the chip C when an impact is applied to the cover glass 1. Such a chip C may be removed by polishing the end surface of the plate glass 5. In this regard, however, the polishing requires quite a number of man-hours, and has difficulty in completely removing the chip.

FIG. 4 illustrates the plate glass 5 cut out from the raw material plate 8 with its surfaces reinforced. In the end surface of the plate glass 5, the naked layer 2, the reinforcing layer 3, and the reinforcing layer 4 are exposed. Nevertheless, in another possible structure, the end surface of the plate glass 5 is formed by a reinforcing layer and keeps the naked layer 2 unexposed. For example, if the surfaces of the plate glass 5 are reinforced after the plate glass 5 is cut out from the raw material plate 8, the end surface of the plate glass 5 is formed by the reinforcing layer and the naked layer 2 is not exposed.

The chip C illustrated in FIG. 4 is just one example, and a chip C is not limited to the form in FIG. 4. For example, a chip C may be a chip extending from the reinforcing layer 3 to the reinforcing layer 4, or a chip C may be generated over the entire outer peripheral edge of the plate glass 5.

Figure 5A:
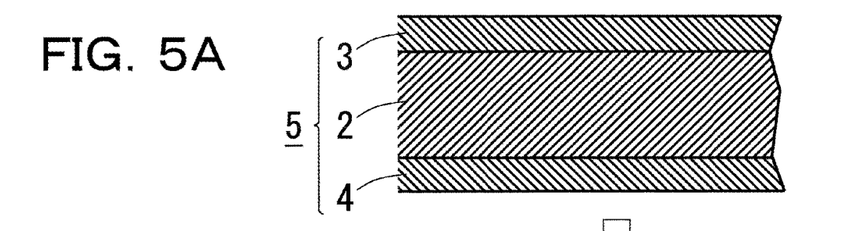
FIGS. 5A, 5B, and FIG. 5C are views illustrating a process to form an inorganic coating and a resin coating.
Figure 5B:
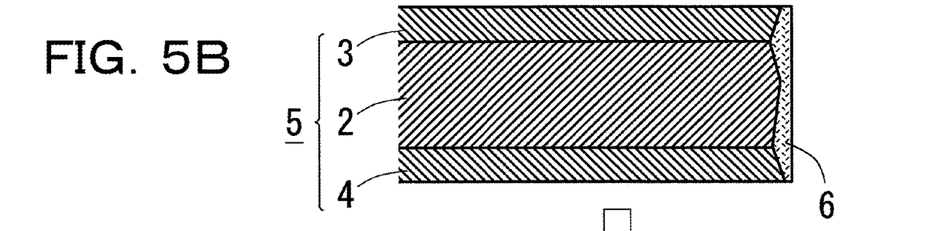
Figure 5C:
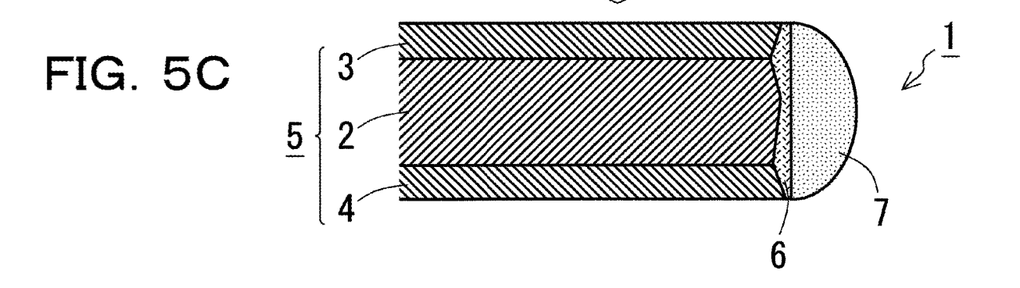

FIGS. 5A, 5B, and 5C are views illustrating a process to form the inorganic coating 6 and the resin coating 7. After the plate glass 5 is cut out from the raw material plate 8, the end surface of the plate glass 5 is coated. The coating is applied to the entire outer peripheral edge of the plate glass 5. As a result of this, the end surface of the plate glass 5 is covered with the inorganic coating 6 over the entire outer peripheral edge of the plate glass 5 (from FIGS. 5A and 5B). If, for example, a siloxane-based coating agent is used, the inorganic coating 6 may be formed by heating at 160° C. for 5 minutes after the coating agent is applied to the end surface of the plate glass 5. After the inorganic coating 6 is formed, a material such as an ultraviolet curable resin, for example, which is softer even after curing than the plate glass 5 and the inorganic coating 6, is applied and then is cured through ultraviolet irradiation or the like. In this way, the resin coating 7 is formed to be overlaid on the inorganic coating 6 (from FIGS. 5B and 5C).

Figure 6:
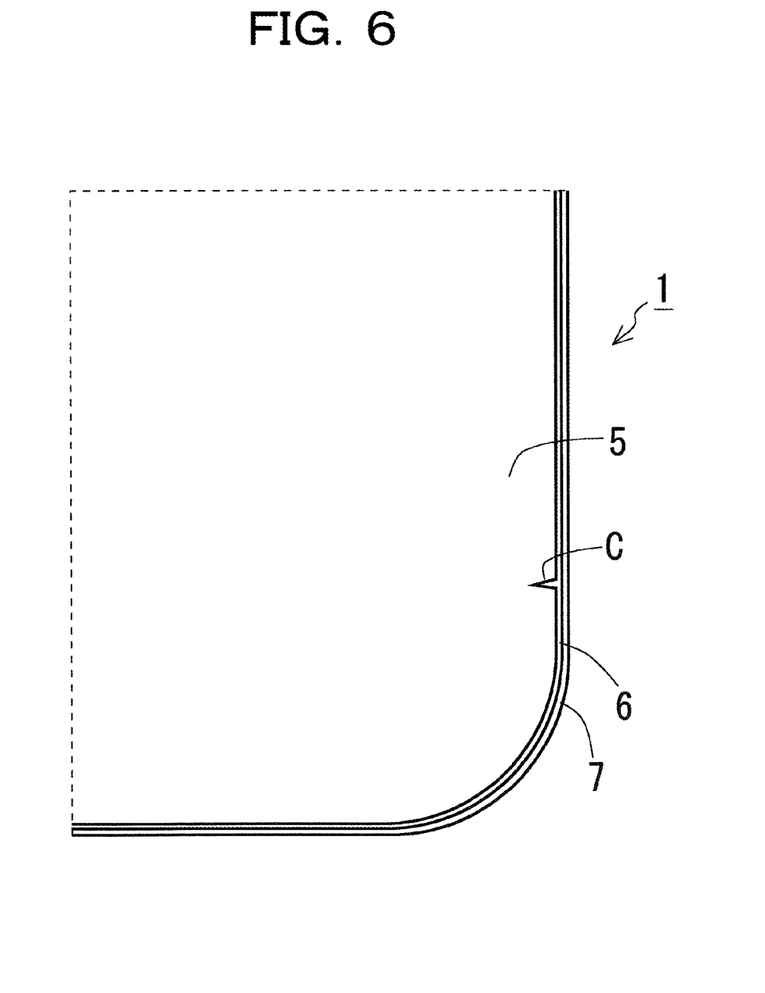
FIG. 6 is a view illustrating a state in which a chip C is filled up.

FIG. 6 is a view illustrating a state in which a chip C is filled up. When the end surface of the plate glass 5 is coated with the inorganic coating 6, the chip C in the end surface of the plate glass 5 is filled up with the inorganic coating 6. The inorganic coating 6 filling up the chip C is a siloxane coating having physical properties similar to those of the glass forming the plate glass 5. Thus, the chip C in the end surface of the plate glass 5 is practically removed or patched. Thus, chances of occurrence of cracking from the chip C with application of an impact to the cover glass 1 are reduced to the minimum possible extent. Moreover, since the chip C is patched, light scattering due to the chip C is also reduced.

As illustrated in FIG. 6, the resin coating 7 that is softer than the plate glass 5 and the inorganic coating 6 is arranged at the outermost edge portion of the cover glass 1, and forms the outer edge of the cover glass 1. In this structure, the resin coating 7 relieves an impact transmitted to the plate glass 5 from an object hitting against the edge of the cover glass 1. Hence, even though the end surface of the plate glass 5 is not polished after the plate glass 5 is cut out from the raw material plate 8, the cover glass 1 achieves higher impact resistance than a comparative example in which the inorganic coating 6 and the resin coating 7 are not provided to the plate glass 5.

Figure 7A:
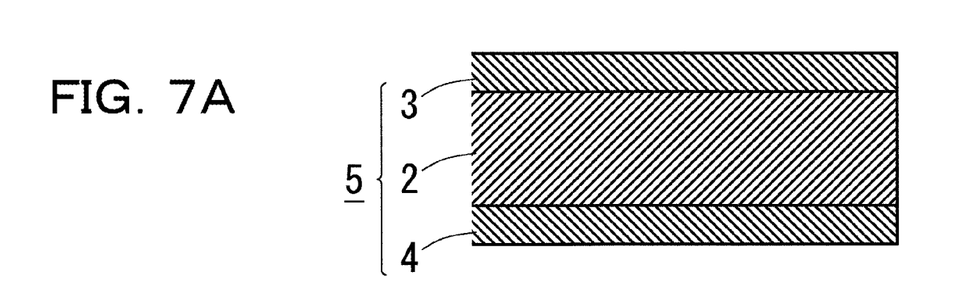
FIGS. 7A, 7B, and 7C are views illustrating variations of an end structure of a plate glass.
Figure 7B:
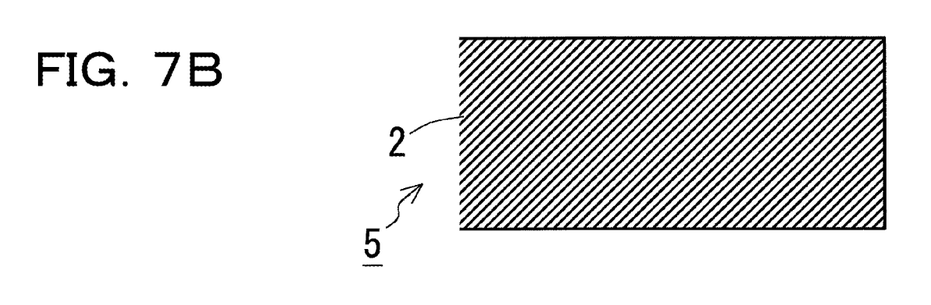
Figure 7C:
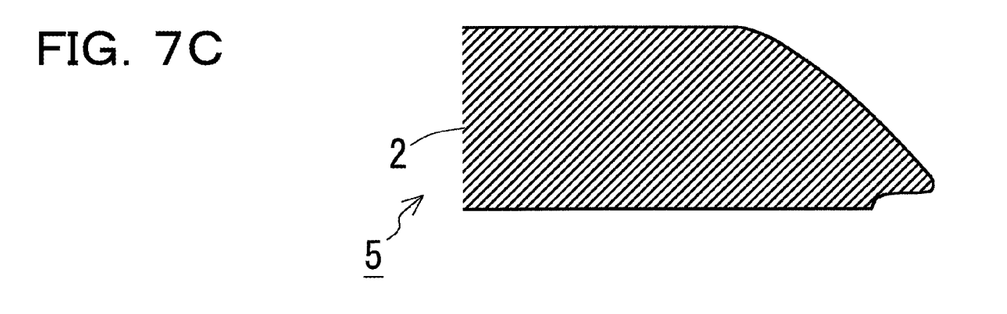

FIGS. 7A, 7B, and 7C are views illustrating variations of the structure of an end portion of the plate glass 5. The plate glass 5 may employ not only a design in which the reinforcing layers 3 and 4 are formed by reinforcing the surfaces as described above (see FIG. 7A), but also a design in which the surfaces are not reinforced (see FIG. 7B), a design of what is termed a 2.5D glass in which the end surface is inclined obliquely (see FIG. 7C), or any of various other designs.

Figure 8:
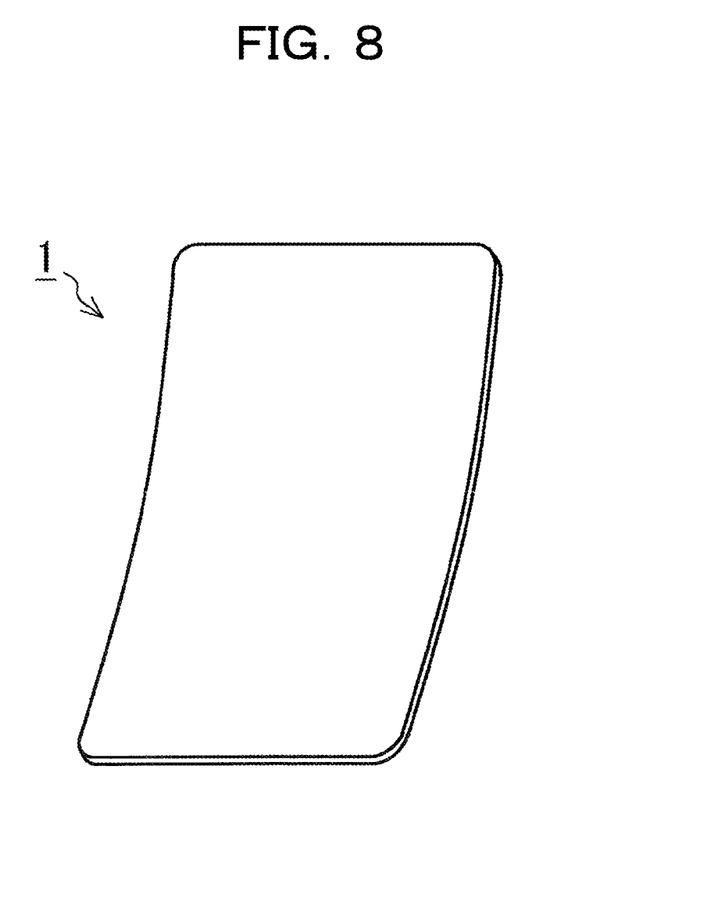
FIG. 8 is a view illustrating a variation of the whole shape of a cover glass.

FIG. 8 is a view illustrating a variation of the whole shape of the cover glass 1. The cover glass 1 is not to be limited to a flat plate-shaped body as described above. The cover glass 1 may be, for example, a non-flat plate-shaped body like a shape curved as a whole like a 3D glass.

FIGS. 9A, 9B, 9C, 9D, 9E, 9F, 9G, 9H, 9I, 9J, 9K, and 9L are views illustrating variations of the design of the inorganic coating 6 and the resin coating 7.

Figure 9A:
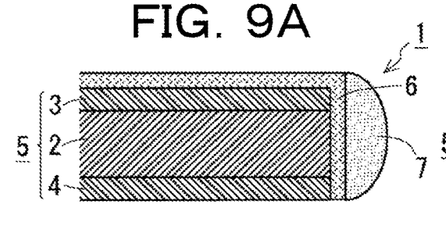
FIGS. 9A, 9B, 9C, 9D, 9E, 9F, 9G, 9H, 9I, 9J, 9K, and 9L are views illustrating variations of the structures of a inorganic coating and a resin coating.

For example, as illustrated in FIG. 9A, the cover glass 1 may employ a design in which the inorganic coating 6 covers the front or back surface of the plate glass 5 in addition to the side surface of the plate glass 5. When the front or back surface of the plate glass 5 is covered with the inorganic coating 6, the entire plate glass 5 is protected by the inorganic coating 6, and the impact resistance of the cover glass 1 is further improved.

Figure 9B:
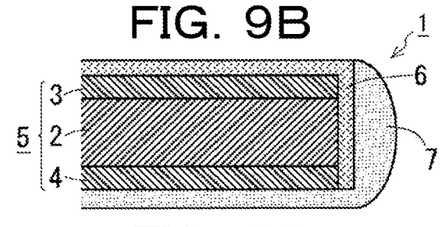

Alternatively, for example, as illustrated in FIG. 9B, the cover glass 1 may employ a design in which one of the front and back surfaces of the plate glass 5 is covered with the inorganic coating 6 and the other surface of the plate glass 5 is covered with the resin coating 7. When the front and back surfaces of the plate glass 5 are covered with the inorganic coating 6 and the resin coating 7, the entire plate glass 5 is protected by the inorganic coating 6 and the resin coating 7, and the impact resistance of the cover glass 1 is further improved.

Figure 9C:
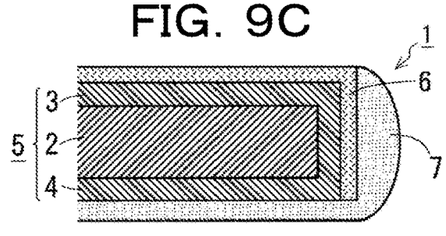

Alternatively, for example, as illustrated in FIG. 9C, the cover glass 1 may employ a design in which one of the front and back surfaces of the plate glass 5, the end surface of which is reinforced, is covered with the inorganic coating 6 and the other surface of the plate glass 5 is covered with the resin coating 7. When the front and back surfaces of the plate glass 5 are covered with the inorganic coating 6 and the resin coating 7, the entire plate glass 5 is protected by the inorganic coating 6 and the resin coating 7, and the impact resistance of the cover glass 1 is further improved.

Figure 9D:
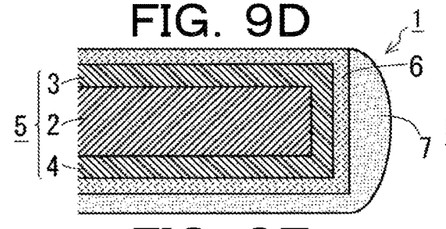

Alternatively, for example, as illustrated in FIG. 9D, the cover glass 1 may employ a design in which both of the front and back surfaces of the plate glass 5, the end surface of which is reinforced, are covered with the inorganic coating 6 and one of the front and back surfaces of the plate glass 5 is covered with the resin coating 7. When the front and back surfaces of the plate glass 5 are covered with the inorganic coating 6 and the resin coating 7, the entire plate glass 5 is protected by the inorganic coating 6 and the resin coating 7, and the impact resistance of the cover glass 1 is further improved.

Figure 9E:
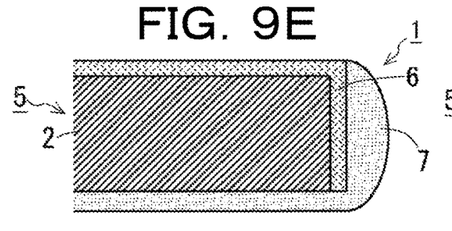
Figure 9F:
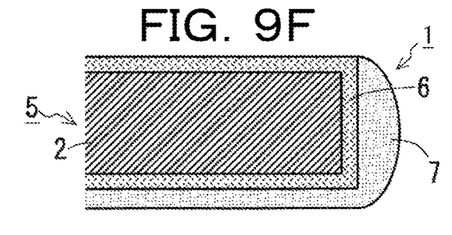

A design in which the plate glass 5 is covered with the inorganic coating 6 and the resin coating 7 is also effective in a case where the plate glass 5 does not include the reinforcing layer 3 and the reinforcing layer 4. For example, as illustrated in FIG. 9E, a design in which one of the front and back surfaces of the plate glass 5 is covered with the inorganic coating 6 and the other surface of the plate glass 5 is covered with the resin coating 7 allows even the plate glass 5, in which the front and back surfaces of the naked layer 2 are not reinforced by the reinforcing layers 3 and 4, to reduce the possibility of damaging the front or back surface of the plate glass 5. Alternatively, for example, as illustrated in FIG. 9F, a design in which both of the front and back surfaces of the plate glass 5 are covered with the inorganic coating 6, and one of the front and back surfaces of the plate glass 5 is covered with the resin coating 7 allows even the plate glass 5, in which the front and back surfaces of the naked layer 2 are not reinforced by the reinforcing layers 3 and 4, to reduce the possibility of damaging the front or back surface of the plate glass 5.

The modified examples described above with reference to FIGS. 9A to 9F are also similarly applicable to what is termed 2.5D glasses in each of which the end surface of the naked layer 2 is inclined obliquely.

Figure 9G:
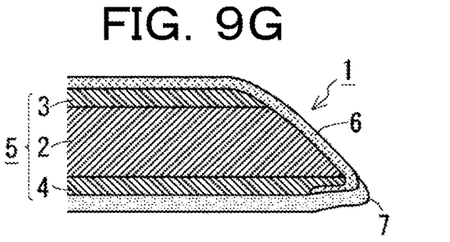
Figure 9H:
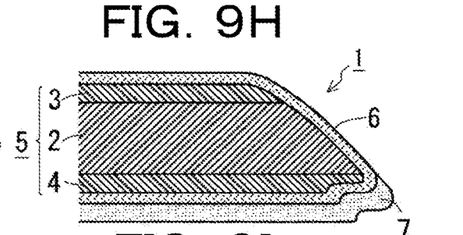
Figure 9I:
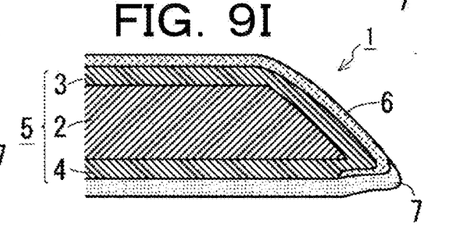
Figure 9J:
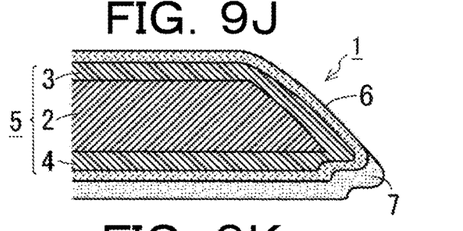

For example, as illustrated in FIG. 9G, the inorganic coating 6 designed to cover the front or back surface of the plate glass 5 in addition to the side surface of the plate glass 5 is applicable to a 2.5D plate glass 5 including the end surface inclined obliquely. Alternatively, for example, as illustrated in FIG. 9H, the inorganic coating 6 designed to cover one of the front and back surfaces of the plate glass 5 and the resin coating 7 designed to cover the other surface of the plate glass 5 are applicable to a 2.5D plate glass 5 including the end surface inclined obliquely. Alternatively, for example, as illustrated in FIG. 9I, the inorganic coating 6 designed to cover one of the front and back surfaces of the plate glass 5, the end surface of which is reinforced, and the resin coating 7 designed to cover the other surface of the plate glass 5 are applicable to a 2.5D plate glass 5 including the end surface inclined obliquely. Alternatively, for example, as illustrated in FIG. 9J, the inorganic coating 6 designed to cover both of the front and back surfaces of the plate glass 5, the end surface of which is reinforced, and the resin coating 7 designed to cover one of the front and back surfaces of the plate glass 5 are applicable to a 2.5D plate glass 5 including the end surface inclined obliquely.

Figure 9K:
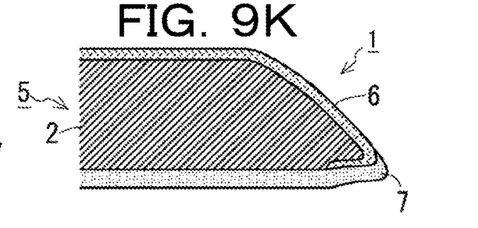
Figure 9L:
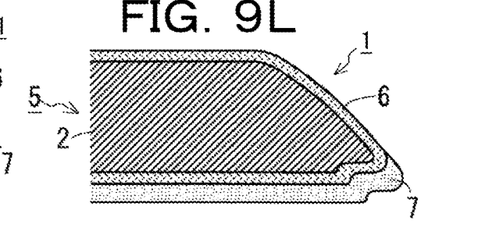

The design in which the 2.5D plate glass 5 is covered with the inorganic coating 6 and the resin coating 7 is particularly effective in the case where the plate glass 5 does not include the reinforcing layer 3 and the reinforcing layer 4. For example, as illustrated in FIG. 9K, a design in which one of the front and back surfaces of the 2.5D plate glass 5 is covered with the inorganic coating 6, and the other surface of the plate glass 5 is covered with the resin coating 7 allows even the plate glass 5, in which the front and back surfaces of the naked layer 2 are not reinforced by the reinforcing layers 3 and 4, to reduce the possibility of damaging the front or back surface of the plate glass 5. Alternatively, for example, as illustrated in FIG. 9L, a design in which both of the front and back surfaces of the 2.5D plate glass 5 are covered with the inorganic coating 6, and one of the front and back surfaces of the plate glass 5 is covered with the resin coating 7 allows even the plate glass 5, in which the front and back surfaces of the naked layer 2 are not reinforced by the reinforcing layers 3 and 4, to reduce the possibility of damaging the front or back surface of the plate glass 5.

With the designs illustrated in FIGS. 9B to 9L, the resin coating 7 may also play a role as an adhesive to bond the cover glass 1 to a casing of an electronic device.

In the designs illustrated in FIGS. 9G to 9L, the end surface of the plate glass 5 is covered with the inorganic coating 6, while the end surface of the plate glass 5 is not covered with the resin coating 7 arranged in the outermost edge portion. Thus, the resin coating 7 protrudes sideways at the edge of the end surface of the plate glass 5. Thus, these designs keep a good aesthetic look of the 2.5D glass adorned with a premium edge.

Figure 10:
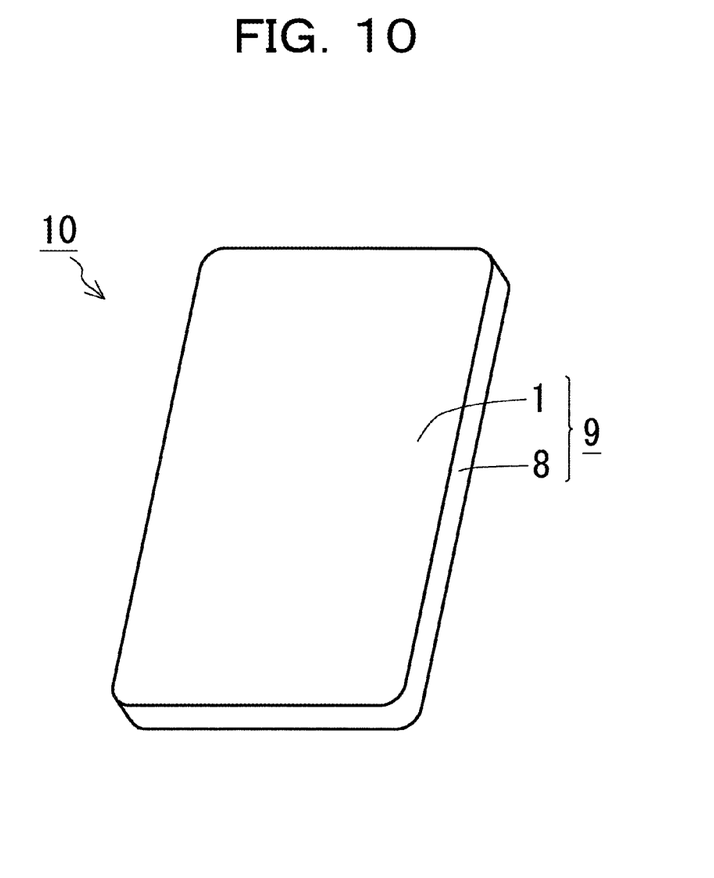
FIG. 10 is a view illustrating an application example of a cover glass.

FIG. 10 is a view illustrating an application example of the cover glass 1. For example, as illustrated in FIG. 10, the cover glass 1 is applicable to a smartphone 10 (which is an example of an "electronic device" in the present disclosure) including a casing 9 formed of the cover glass 1 and a raw material plate 8. Since the smartphone 10 is an electronic device which a user holds and operates by hand, there is a high possibility that the smartphone 10 falls on a floor or the like and receives an impact. In this respect, if the cover glass 1 is used in the casing 9 of the smartphone 10, the cover glass 1 withstands the impact applied when the smartphone 10 falls on a floor or the like, so that the possibility of cracking in the plate glass 5 is low.

In order to examine the effect of the cover glass 1 according to the above-described embodiment, the impact test was conducted and the results are described below. In this test, a plate glass 5 having a thickness of 0.6 mm with a long side of 150 mm and a short side of 70 mm was prepared. The plate glass 5 was a tempered glass having a compressive stress (CS) of 600 MPa and reinforced by reinforcing layers 3 and 4 with a thickness (DOL: depth of layer) of 30 μm. A siloxane-based coating agent was applied to the glass plate 5 and heated at 160° C. for 5 minutes to form an inorganic coating 6 having a thickness of 300 nm. Next, an ultraviolet curable resin was applied to the back surface to the end surface to form a resin coating 7 having a Vickers hardness of 70. In this way, a test piece corresponding to the cover glass 1 of the above-described embodiment was prepared. In the strength test, a pendulum hammer to swing about a pivot located right above the edge of the test piece was prepared, and the mass of the weight attached to the hammer and the swing angle were changed stepwise. As a result of the strength test, it was observed that the test piece corresponding to the cover glass 1 of the above-described embodiment was able to withstand an impact force of about 0.7 to 0.8 J even though the end surface was not polished. On the other hand, in the case of a comparative example in which the inorganic coating 6 and the resin coating 7 were not provided on the end surface of the glass and the cross section of the glass was exposed, it was observed that the test piece was able to withstand only an impact force of about 0.3 J.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A casing, comprising:
a plate-shaped cover glass that includes a first surface and a second surface which is opposite side of the first surface, and used for an exterior portion of an article;
an inorganic coating that exposes the first surface and the second surface and covers an end surface of the cover glass that connects the first surface and the second surface; and
a resin coating that at least partially covers the inorganic coating so as to be separated from the cover glass and forms an outer edge of the cover glass.

2. The casing according to claim 1, wherein
the cover glass is a glass, front and back surfaces of which are formed by reinforcing layers, and
the inorganic coating covers the end surface of the cover glass in which a naked layer is exposed.

3. The casing according to claim 1, wherein
the cover glass is a glass, front, back, and end surfaces of which are formed by a reinforcing layer, and
the inorganic coating is overlaid at least on a part of the reinforcing layer forming the end surface of the cover glass.

4. The casing according to claim 1, wherein
the cover glass is a glass in which the end surface is formed by a surface gradually inclined from an edge of the front surface, and
the resin coating forms the outer edge of the cover glass at an edge of the end surface of the cover glass.

5. The casing according to claim 1, wherein
the end surface of the cover glass includes defects, and
the inorganic coating is filled into cavities of the defects.

6. The casing according to claim 1, wherein
the resin coating covers a top surface of the inorganic coating parallel to the end surface of the cover glass, and
a side surface of the inorganic coating perpendicular to the end surface of the cover glass is exposed.

7. The casing according to claim 1, wherein the inorganic coating and the resin coating are provided over an entire outer peripheral edge of the cover glass.

8. The casing according to claim 1, wherein
the top surface of the inorganic coating is a flat surface, and
the resin coating is formed in a semi-cylindrical shape on the flat surface.

9. The casing according to claim 1, wherein the resin coating is formed of an ultraviolet curable resin.

* * * * *